United States Patent
DeNatale et al.

(10) Patent No.: US 7,829,462 B2
(45) Date of Patent: Nov. 9, 2010

(54) THROUGH-WAFER VIAS

(75) Inventors: Jeffrey F. DeNatale, Thousand Oaks, CA (US); Stefan C. Lauxtermann, Camarillo, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 227 days.

(21) Appl. No.: 11/800,098

(22) Filed: May 3, 2007

(65) Prior Publication Data

US 2008/0272499 A1 Nov. 6, 2008

(51) Int. Cl.
  H01L 21/44 (2006.01)
  H01L 21/66 (2006.01)
(52) U.S. Cl. ...................................... 438/667
(58) Field of Classification Search ................. 257/758; 438/667
  See application file for complete search history.

(56) References Cited

U.S. PATENT DOCUMENTS

| | | | |
|---|---|---|---|
| 4,855,017 A | 8/1989 | Douglas | 156/643 |
| 4,961,821 A | 10/1990 | Drake et al. | 156/647 |
| 5,300,816 A * | 4/1994 | Lee et al. | 257/797 |
| 5,421,083 A | 6/1995 | Suppelsa et al. | 29/852 |
| 5,501,893 A | 3/1996 | Laermer et al. | 428/161 |
| 5,739,587 A * | 4/1998 | Sato | 257/758 |
| 6,278,181 B1 | 8/2001 | Maley | 257/712 |
| 6,356,173 B1 * | 3/2002 | Nagata et al. | 333/247 |
| 6,458,615 B1 | 10/2002 | Fedder et al. | 438/50 |
| 6,565,730 B2 | 5/2003 | Chakravorty et al. | 205/122 |
| 6,590,165 B1 * | 7/2003 | Takada et al. | 174/266 |
| 6,607,938 B2 * | 8/2003 | Kwon et al. | 438/109 |
| 6,611,052 B2 * | 8/2003 | Poo et al. | 257/686 |
| 6,716,737 B2 | 4/2004 | Plas et al. | 438/612 |
| 6,717,071 B2 | 4/2004 | Chang et al. | 174/266 |
| 6,852,627 B2 | 2/2005 | Sinha et al. | 438/687 |
| 6,876,076 B2 * | 4/2005 | Gloria et al. | 257/728 |
| 6,960,479 B2 | 11/2005 | Li et al. | 438/3 |

(Continued)

FOREIGN PATENT DOCUMENTS

EP 095723 A1 6/1999

(Continued)

OTHER PUBLICATIONS

Semiconductor Equipment Assessment, Results Bulletin, Microsystems Production Evaluated STS Aspect Silicon Etch Cluster Tool, available online at: http://www.sea.rl.ac.uk/NewSEA/newpubs/microspect/microspect_results.pdf.

(Continued)

Primary Examiner—Matthew W Such
Assistant Examiner—Ali Naraghi
(74) Attorney, Agent, or Firm—Koppel, Patrick, Heybl & Dawson

(57) ABSTRACT

A through-wafer via interconnect region is in a circuit portion of a wafer, the circuit portion including at least one electrically conducting metal layer and configured for use, after dicing of the wafer, as one of a plurality of layers stacked vertically to form a three dimensional integrated circuit. Within the metal layer in the circuit portion, the metal is removeably distributed such that the ratio of metal to nonmetal area, within the via region, varies by less than a predetermined amount from the ratio of metal to nonmetal area outside the via region.

3 Claims, 4 Drawing Sheets

U.S. PATENT DOCUMENTS

| | | | |
|---|---|---|---|
| 6,960,495 B2 | 11/2005 | Vyvoda et al. | 438/131 |
| 6,963,483 B2 | 11/2005 | Chakravorty et al. | 361/306.3 |
| 6,968,110 B2 | 11/2005 | Patel et al. | 385/131 |
| 6,984,561 B2 | 1/2006 | Herner et al. | 438/257 |
| 6,995,072 B2 | 2/2006 | Walker et al. | 438/400 |
| 7,060,595 B2 * | 6/2006 | Ou et al. | 438/484 |
| 7,498,520 B2 * | 3/2009 | Osaka et al. | 174/250 |
| 2002/0134581 A1 | 9/2002 | Figueroa | |
| 2002/0163072 A1 * | 11/2002 | Gupta et al. | 257/698 |
| 2003/0003724 A1 | 1/2003 | Uchiyama et al. | |
| 2003/0104649 A1 | 6/2003 | Ozgur et al. | 438/50 |
| 2004/0069529 A1 | 4/2004 | Oggioni et al. | |
| 2004/0084761 A1 * | 5/2004 | Karthikeyan et al. | 257/700 |
| 2004/0119166 A1 | 6/2004 | Sunohara | |
| 2004/0166688 A1 | 8/2004 | Xie et al. | 438/706 |
| 2005/0093048 A1 | 5/2005 | Griffiths | |
| 2005/0093049 A1 | 5/2005 | Kundalgurki et al. | |
| 2005/0099762 A1 | 5/2005 | Wermer et al. | |
| 2005/0224921 A1 * | 10/2005 | Gupta et al. | 257/621 |
| 2005/0287760 A1 | 12/2005 | Yan et al. | 438/404 |
| 2006/0003566 A1 | 1/2006 | Emesh | 438/597 |

FOREIGN PATENT DOCUMENTS

| | | |
|---|---|---|
| WO | WO 8302368 A1 | 7/1983 |
| WO | WO 9908318 | 2/1999 |

OTHER PUBLICATIONS

Garrou, Phillip, Future ICs Go Vertical, Research & Development Institute, Feb. 1, 2005, pp. 1-8.

George, S. M. et al., Surface Chemistry for Atomic Layer Growth, J. Phys. Chem., vol. 100, No. 31, 1996, pp. 13121-13131.

Eisenbraun, et al., 3D Integration—The packaging technology for tomorrow's performance needs, Chip 9, pp. 14-17 (Unaxis Semiconductors, Sep. 2003).

Liu, Progress in MEMS and Micro Systems Research, IMAPS/ACerS 1st International Conference and Exhibition on Ceramic Interconnect and Ceramic Microsystems Technologies (CICMT), Baltimore Marriott Waterfront Hotel, Baltimore, MD (Apr. 10-13, 2005).

Pham, et al., IC-Compatible Two-Level Bulk Micromachining Process Module for RF Silicon Technology, IEEE Transactions on Electron Devices, vol. 48, No. 8, pp. 1756-1764 (Aug. 2001).

* cited by examiner

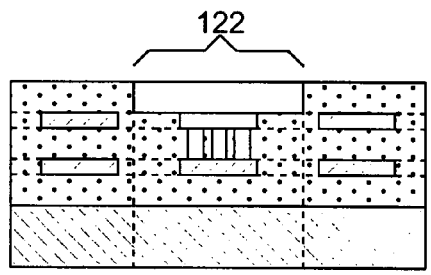
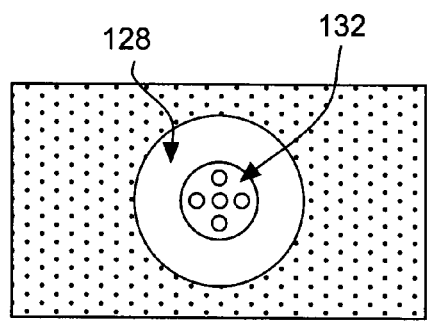
FIGURE 4A          FIGURE 4B
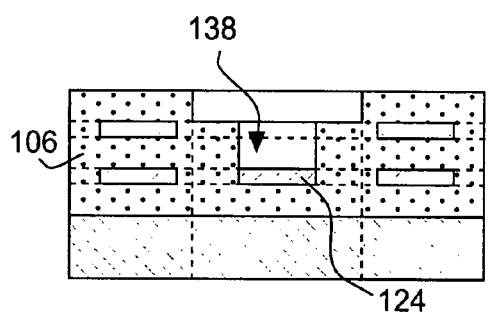
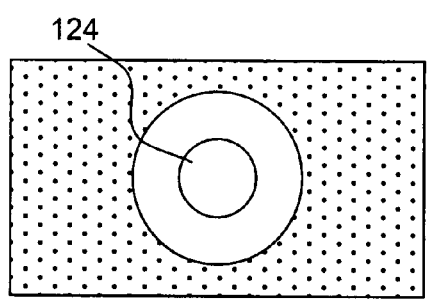
FIGURE 5A          FIGURE 5B
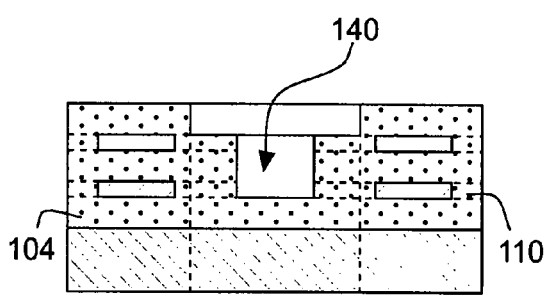
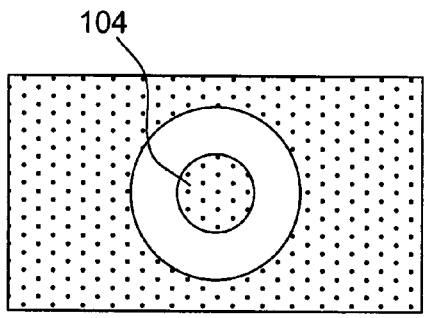
FIGURE 6A          FIGURE 6B

THROUGH-WAFER VIAS

BACKGROUND OF THE INVENTION

The present invention relates to electronic circuits, and particularly to three dimensional electronic circuits that require vertical electrical interconnections between two or more layers in such circuits.

As high performance integrated circuit designs have been improved to provide greater speed of operation and to handle higher power levels, the technology for providing electrical interconnects in such circuits has become an increasingly significant issue. In operation, more powerful integrated circuits tend to use a greater proportion of their clock cycles to charge interconnect conductors, causing RC-induced delays and power consumption to become limiting factors for the performance of the circuit.

One approach to addressing this limitation is to move from two dimensional to three dimensional (3D) integration of a circuit's electronic components. In this approach, the components are fabricated on two or more separate wafers or dies, then integrated into a single chip-scale integrated circuit package.

3D integration allows the inclusion in a single integrated circuit of otherwise incompatible technologies, while providing significant advantages in performance, functionality, and form factor, as well as reduced size, weight, and power consumption. In addition, improved circuit performance results from reductions in inter-chip power, ground, and signal distribution line lengths, thereby significantly reducing signal propagation delays associated with chip-to-chip electrical signals.

Initial efforts toward 3D integration achieved inter-chip interconnects through wire bonding, bumped wafers, or connections over the edge of the die. Continued improvements in 3D integration led to through-wafer via interconnects, which provide electrical connections between various portions of the device circuitry by passing through the wafer, substrate, or other layers of the device. Multiple layers of routing metal, with the layers separated by dielectric material, are common elements of multilayer circuit processes, and these metal layers can be employed for horizontal (in-plane) signal routing.

A particular advantage of the through-wafer via approach to interconnects is the ability to employ die-level assembly. This permits selection of tested, known-good-die for 3D assembly. This also permits multiple layers of a three dimensional integrated circuit to be incorporated in a single photolithography reticle, processed at wafer level and diced into separate die, then stacked and bonded together in subsequent assembly processing.

The more traditional wafer-level assembly process, by contrast, requires a separate wafer for each layer of the integrated circuit, leading to the expense of a separate process run for each wafer. The net yield of the 3D stack may be low for advanced circuit processes as a result of low individual die yields. Further, by combining all of the integrated circuit layers in a single mask, processing the layers in a single wafer run, then dicing and stacking the layers as individual die, the fabrication cost for developing prototypes of the circuit can be significantly reduced.

One application, for example, that exploits the benefits of 3D integration using via interconnects is electronic imaging arrays. The integration of sensor arrays with 3D stacked layers of readout and signal processing circuitry can enable the implementation of massively parallel, densely interconnected imaging focal plane architectures, resulting in high resolution, high fill factor pixels, ultra-wide dynamic range, multispectral capability, and very fast imaging performance.

The implementation of a through-wafer via in a wafer requires that an exclusion zone be designed into the wafer at the point where the via will be located in each layer of the 3D integrated circuit. This exclusion zone must be free of circuit elements, such as transistors, and routing metals. Unfortunately, however, the nonuniformity of metal coverage caused by the presence of such exclusion zones can lead to the development of significant local topology, known as dishing, in the wafer during processing.

The severity of this dishing effect can be appreciated by considering the structure of a typical multilayer CMOS wafer, which may contain, for example, seven layers of routing metal, with dielectric layers on either side of each of the metal layers. In regions where there is no metal in one of the metal layers, a dishing effect will occur due to incomplete planarization. In regions where there is no metal in any of the metal layers, i.e., the exclusion zones, the dishing effect is compounded. In addition, if the distribution of metal density is non uniform across the wafer (for example, some regions have a high density of vias and hence many exclusion zones, while other regions have no vias and thus a relatively high density of metal) large changes in topology occur across the die area. This variation can cause a severe defocus during photolithographic processing, since all of the regions cannot be in focus simultaneously. The defocusing impairs or eliminates the ability to pattern fine features on the wafer. If the only effect was dishing at the via locations, the problem would be less serious, since there is no circuitry at those locations. Since the dishing phenomenon affects the ability to pattern the entire circuit, however, due to the topology introduced, the problem can become severe.

The dishing problem is exacerbated because the exclusion zones/absent metal layers are necessarily aligned vertically in all levels, at the location of each through-wafer via. Such dishing can detract from circuit functionality and yield, and is not limited to the via regions, but can affect the ability to properly pattern any portion of the circuit. The dishing effect is significant enough that it can prevent the ability to combine multiple independent die designs (layers) in a single reticle, thereby eliminating a key advantage of the through-wafer via interconnect.

Moreover, as processing advances to finer lines, the dishing effect becomes even more severe, since the depth of focus is reduced for smaller feature sizes and because a larger number of metal layers is typically involved in such advanced processing techniques.

For these reasons, a need has developed in the art for a through-wafer via interconnect which can be incorporated in 3D circuit design and processing while avoiding the negative effects of dishing.

BRIEF SUMMARY OF THE INVENTION

A through-wafer via interconnect region is located within a circuit portion of a wafer. The circuit portion includes at least one electrically conducting metal layer and is configured for use, after dicing of the wafer, as one of a plurality of layers stacked vertically to form a three dimensional integrated circuit. The via region is structured so that, within the metal layer, removable metal is distributed such that the ratio of metal to nonmetal area, within the via region, varies by less than a predetermined amount from the ratio of metal to nonmetal area outside the via region. It is particularly desirable that the predetermined variation in the ratio of metal to nonmetal area is sufficiently low to prevent dishing when the three dimensional integrated circuit is formed.

In a more particular embodiment, the electrically conducting metal layer is a first electrically conducting metal layer and the circuit portion includes a second electrically conducting metal layer and an electrically insulating layer separating the first and second metal layers, with the distribution of removable metal, within the second metal layer, selected such that the ratio of metal to nonmetal area, within the via region, varies by less than a predetermined amount from the ratio of metal to nonmetal area outside the via region.

A second through-wafer via interconnect region may be located within a second circuit portion of the wafer, the second circuit portion including the metal layer and being configured for use, after dicing of the wafer, as another layer in the plurality of layers stacked vertically to form the three dimensional integrated circuit, the second via region having, within the metal layer, a distribution of removable metal selected such that the ratio of metal to nonmetal area, within the via region, varies by less than a predetermined amount from the ratio of metal to nonmetal area outside the via region.

In a particular embodiment, the via region is cylindrical in cross section.

A method of making a through-wafer via interconnect region, includes the steps of providing a wafer and defining a circuit portion of the wafer, where the circuit portion is configured for use, after dicing of the wafer, as one of a plurality of layers stacked vertically to form a three dimensional integrated circuit. A through-wafer via interconnect region is defined within the circuit portion, then an electrically conducting metal layer is formed within the circuit portion such that metal in the metal layer is removably distributed with a ratio of metal to nonmetal area, within the via region, that varies by less than a predetermined amount from the ratio of metal to nonmetal area outside the via region.

A method of making through-wafer via interconnect regions begins by providing a wafer, then defining a first circuit portion of the wafer, the first circuit portion being configured for use, after dicing of the wafer, as one of a plurality of layers stacked vertically to form a three dimensional integrated circuit. A first through-wafer via interconnect region is defined within the first circuit portion. Next, a second circuit portion is defined in the wafer, the second circuit portion being configured for use, after dicing of the wafer, as another layer in the plurality of layers stacked vertically to form a three dimensional integrated circuit. A second through-wafer via interconnect region is defined within the second circuit portion.

A first electrically conducting metal layer within the first and second circuit portions is configured such that metal in the first metal layer is removably distributed with a ratio of metal to nonmetal area, within the first and second via regions, that varies by less than a predetermined amount from the ratio of metal to nonmetal area outside the respective via regions A second electrically conducting metal layer within the first and second circuit portions is configured such that metal in the second metal layer is removably distributed with a ratio of metal to nonmetal area, within the first and second via regions, that varies by less than a predetermined amount from the ratio of metal to nonmetal area outside the respective via regions Finally, an electrically insulating dielectric layer is provided to separate the first and second metal layers.

A method of making a circuit portion starts by providing a wafer that includes a substrate, then defining a portion of the wafer as the circuit portion. Regions of active semiconducting devices are processed by appropriate fabrication techniques. Next, a first electrically insulating layer is deposited on the substrate and a first electrically conducting metal layer is deposited on the insulating layer. These metal and insulator layers are typically used to form passive circuit elements, interconnects between active devices, and routing lines in the circuit.

A plurality of semiconducting devices are fabricated in this manner that incorporate the metal and dielectric layers described above and a through-wafer via interconnect region is defined within the circuit portion, such that the metal in the metal layer is removably distributed with a ratio of metal to nonmetal area, within the via region, that varies by less than a predetermined amount from the ratio of metal to nonmetal area outside the via region, the circuit portion being thereby configured for use, after dicing of the wafer, as one of a plurality of layers stacked vertically to form a three dimensional integrated circuit.

A second electrically insulating layer is deposited on the first electrically conducting metal layer, a second electrically conducting metal layer is deposited on the second insulating layer, and a third electrically insulating layer is deposited on the second electrically conducting metal layer.

A number of metal interconnects are formed within the via region, each interconnect extending through the second insulating layer between the first metal layer and the second metal layer.

Next, the third insulating layer is removed within the via region, the metal in the second metal layer is removed within the via region, the metal interconnects between the first and second metal layers are removed, the second insulating layer is removed within the via region, the metal in the first metal layer is removed within the via region, the first insulating layer is removed within the via region, and the substrate is removed within the via region.

Finally, the periphery of the via region is electrically isolated from the substrate and filled with an electrically conducting metal, thereby creating a through-wafer via interconnect in the circuit portion.

The wafer may then be diced to separate the circuit portion, thereby rendering the circuit portion usable as a layer in a vertically stacked three dimensional integrated circuit.

BRIEF DESCRIPTION OF THE DRAWINGS

FIGS. 1A through 10B depict one embodiment of a method, according to the invention, for making a through-wafer via interconnect. FIGS. 1A, 2A, 3A, 4A, 5A, 6A, 7A, 8A, 9A, and 10A provide cross sectional views in a side elevation, while FIGS. 1B, 2B, 3B, 4B, 5B, 6B, 7B, 8B, 9B, and 10B depict corresponding plan views.

DETAILED DESCRIPTION OF THE INVENTION

FIGS. 1A through 10B depict a method, according to the invention, for making a through-wafer via interconnect. The "A" figure in each pair provides a cross sectional view in a side elevation, while the "B" figure depicts the corresponding plan view.

Figure 1A:
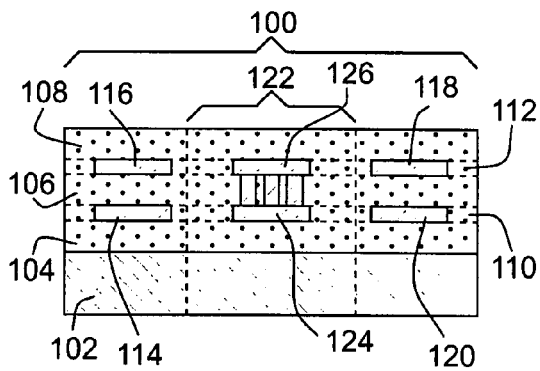
Figure 1B:
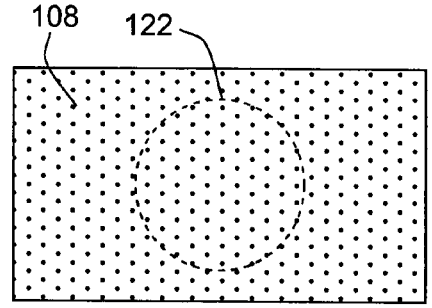

The method begins with a semiconducting wafer, a portion 100 of which is shown in FIGS. 1A and 1B. For reasons that will become clear, the portion 100 of the wafer will be referred to as the circuit portion. The wafer includes a substrate 102 on which active circuitry is fabricated. Electrically insulating layers 104, 106, and 108, as well as electrically conducting metal layers 110 and 112, are deposited on the substrate 102.

As those skilled in the art will appreciate, the relative dimensions of the layers and other elements depicted in the drawings are not to scale, in order to better illustrate the details of the invention. Moreover, an actual wafer could contain additional insulating and conducting layers.

A number of semiconducting devices, which are not shown, may be fabricated on the substrate and may incorporate the insulating and conducting layers. Portions of the metal deposited in the metal layers, such as metal 114, 116, 118, and 120, are used to connect various semiconducting devices and other elements together in electronic circuitry that is fabricated within the circuit portion.

A through-wafer via interconnect region 122 is defined in the wafer, within the circuit portion 100, with metal 124, within metal layer 110, and metal 126, within metal layer 112, being located within the via region 122.

In an outstanding feature of this invention, the metal, in each metal layer and within the circuit portion 100, is removable and is distributed with a ratio of metal to nonmetal area, within the via region, that varies by less than a predetermined amount from the ratio of metal to nonmetal area outside the via region. This arrangement makes the circuit portion particularly amenable to use, after dicing of the wafer, as one of a plurality of layers which are stacked vertically and bonded together to form a three dimensional integrated circuit.

In particular, the metal is removably deposited, within each metal layer and within the circuit portion, such that the predetermined variation in the ratio of metal to nonmetal area is sufficiently low to prevent dishing when the integrated circuit is formed.

Figure 2A:
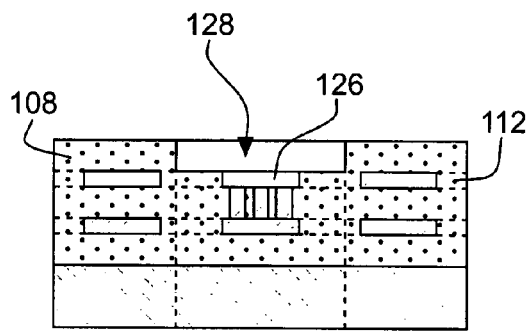
Figure 2B:
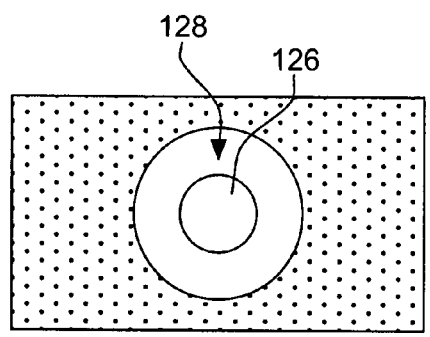
Figure 3A:
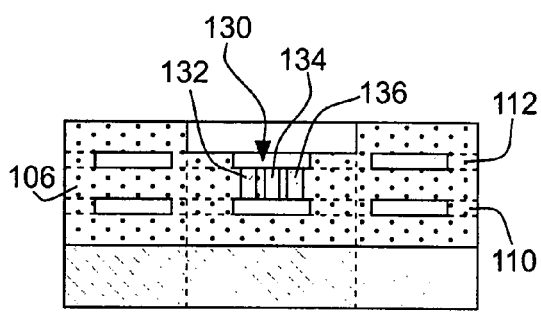
Figure 3B:
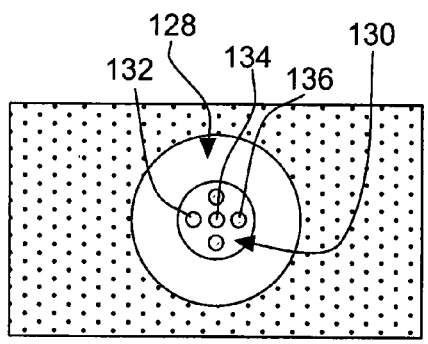

Continuing with FIGS. 2A and 2B, the through-wafer via interconnect is formed by first removing the insulating layer 108, by a suitable process such as wet or dry etching, for example, within the via region, as shown at 128. This step exposes the metal layer 112 within the via region 122. Next, as depicted in FIGS. 3A and 3B, the metal 126, which is in the metal layer 112 within the via region, is removed, as shown at 130. The metal may be removed by etch processes such as wet or dry etching.

Optionally, during the deposition of the conducting and insulating layers, metal interconnects, such as interconnects 132, 134, and 136, can be formed between the metal layers 110 and 112, to facilitate removal of the insulating layer 106. If the interconnects are present, the metal therein is removed next, as shown in FIGS. 4A and 4B, followed by removal of the portion of the insulating layer 106 within the via region 122, as shown at 138 in FIGS. 5A and 5B.

Figure 7A:
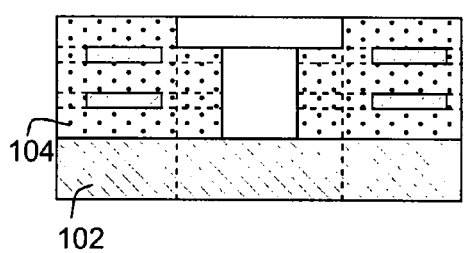
Figure 7B:
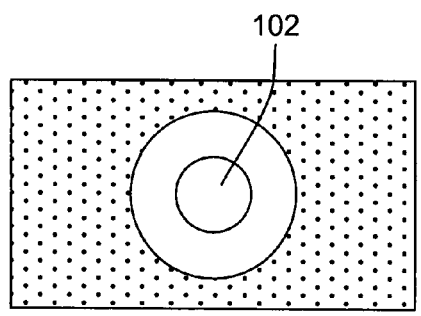
Figure 8A:
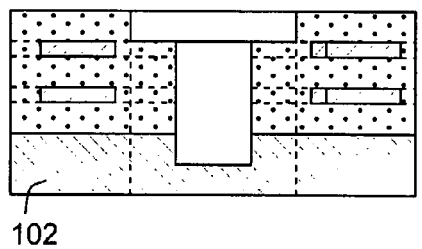
Figure 8B:
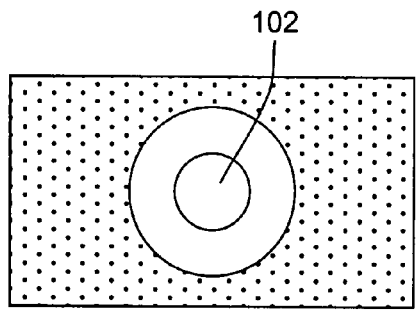
Figure 9A:
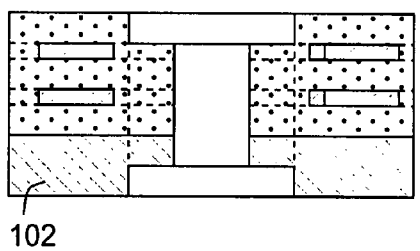
Figure 9B:
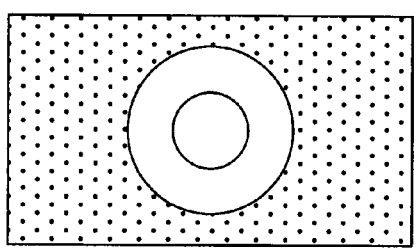

The metal 124 in metal layer 110, and within the via region 122, is then removed, as shown at 140 in FIGS. 6A and 6B. The insulating layer 104 is removed within the via region, as shown in FIGS. 7A and 7B, exposing the substrate 102. This is followed by removal of the substrate 102 within the via region, as depicted in FIGS. 8A through 9B. This removal may be accomplished using techniques for high-aspect dry etching. For circuits using Si as substrate 102, deep reactive ion etch processes using time-sequenced etch and passivate chemistries (commonly known as the "Bosch Process") are well suited to the substrate etch. As illustrated in 9A, this substrate etching may be accomplished from two sides of the wafer. The etch diameter from the side opposite the active circuits can be larger than the front (circuit) side without consuming additional circuit area.

Figure 10A:
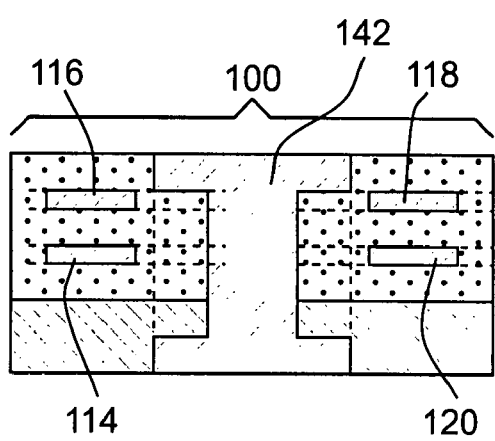
Figure 10B:
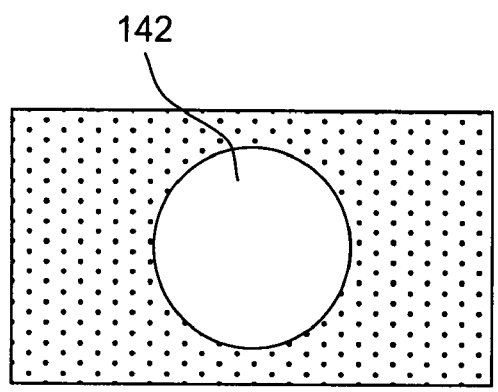

Finally, as depicted in FIGS. 10A and 10B, the peripheral sidewalls of the via region are electrically isolated, then the region is filled with metal to create the through wafer via interconnect 142, which provides electrical continuity from the front to the back of the circuit portion 100.

As will be readily apparent to those skilled in the art, a variety of appropriate metals can be used for the metal layers 110 and 112, the metal interconnects 132, 134 and 136, and the through-wafer via interconnect 142. Similarly, a variety of insulating dielectric materials can be employed for use in the insulating layers 104, 106, and 108.

The via interconnect 142 is depicted in the embodiment shown in the drawings as circular in cross section, although those skilled in the art will appreciate that interconnects with other cross sections may be desirable in particular applications of the invention. Another useful design, for example, could employ a via interconnect region which is square in cross section.

Although the embodiment depicted here includes only a single circuit portion for clarity, those skilled in the art will understand that, in practicing the invention, multiple circuit portions would typically be defined on a single wafer. After processing to create a through-wafer via interconnect within each circuit portion, the wafer would then be diced to separate the circuit portions, then the circuit portions would be bonded together to form multiple layers in a vertically stacked three dimensional integrated circuit.

Moreover, it may be desirable in certain applications to include multiple through-wafer vias within each of the circuit portions. In addition, although in the embodiment depicted in the drawings the through-wafer via is fabricated so that it extends through the wafer without contacting the metal layers, it may be desirable in some applications for the via to make contact with at least some of these layers in order to electrically interface with the circuit. Referring to FIG. 10A, for example, any or all of the metal portions 114, 116, 118 and 120 could be positioned to be in electrical contact with the via 142.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

The invention claimed is:

1. A method of making a circuit portion, comprising: providing a wafer that includes a substrate; defining a portion of the wafer as the circuit portion; fabricating active semiconducting devices in the circuit portion; depositing an electrically insulating layer on the substrate; depositing an electrically conducting metal layer on the insulating layer; fabricating a plurality of semiconducting devices in the layers; and defining a through-wafer via interconnect region within the circuit portion, the through-wafer via interconnect region having removeably distributed metal in the conducting metal layer whereby dishing is prevented between the through-wafer via interconnection region and the remainder of the circuit portion; wherein the electrically conducting metal layer is a first electrically conducting metal layer and the electrically insulating layer is a first electrically insulating layer, further comprising: depositing a second electrically insulating layer on the first electrically conducting metal layer; depositing a second electrically conducting metal layer on the second insulating layer; and depositing a third electrically insulating layer on the second electrically conducting metal layer; forming a plurality of metal interconnects within the through-via interconnect region, each metal interconnect extending through the second insulating layer between the first metal layer and the second metal layer; removing the third insulating layer within the through-via interconnect region; removing the metal in the second metal layer within the through-via interconnect region; removing the metal interconnects between the first and second metal layers; removing the second insulating layer within the through-via interconnect region; removing the metal in the first metal layer within the through-via interconnect region; removing the first insulating layer within the through-via interconnect region; removing the substrate within the through-via interconnect region; electrically isolating the periphery of the through-via interconnect region; and filling the through-via interconnect region with an electrically conducting metal, thereby creating a through-wafer via interconnect in the circuit portion.

2. The method of claim 1, wherein depositing an electrically insulating layer comprises depositing a dielectric layer.

3. The method of claim 1, further comprising:
   dicing the wafer to separate the circuit portion, thereby rendering the circuit portion usable as a layer in a vertically stacked three dimensional integrated circuit.

* * * * *